(12) United States Patent
Watanabe et al.

(10) Patent No.: US 6,185,941 B1
(45) Date of Patent: Feb. 13, 2001

(54) THERMOELECTRIC CONVERTER

(75) Inventors: Hideo Watanabe; Fumikazu Kiya, both of Kanagawa (JP)

(73) Assignee: ECO 21, Inc., Tokyo (JP)

( * ) Notice: Under 35 U.S.C. 154(b), the term of this patent shall be extended for 0 days.

(21) Appl. No.: 09/380,060

(22) PCT Filed: Dec. 25, 1998

(86) PCT No.: PCT/JP98/05963

§ 371 Date: Feb. 8, 2000

§ 102(e) Date: Feb. 8, 2000

(87) PCT Pub. No.: WO99/34451

PCT Pub. Date: Jul. 8, 1999

(30) Foreign Application Priority Data

Dec. 25, 1997 (JP) .................................................. 9-357553

(51) Int. Cl.[7] .................................................. F25B 21/02
(52) U.S. Cl. .................................. 62/3.7; 62/3.2; 62/434
(58) Field of Search ................................ 62/3.7, 3.2, 434

(56) References Cited

U.S. PATENT DOCUMENTS

| | | | | |
|---|---|---|---|---|
| 5,515,683 | * | 5/1996 | Kessler | 62/3.7 |
| 5,987,892 | * | 11/1999 | Watanabe et al. | 62/3.7 |

FOREIGN PATENT DOCUMENTS

| | | |
|---|---|---|
| 820 107 | 1/1998 | (EP) . |
| 878 852 | 11/1998 | (EP) . |
| 61-81579 | 5/1986 | (JP) . |
| 64-22964 | 2/1989 | (JP) . |
| 64-22964 | 2/1992 | (JP) . |
| 6-294560 | 10/1994 | (JP) . |
| 407250741 | * 10/1995 | (JP) . |
| 9-36438 | 2/1997 | (JP) . |
| 409321348 | * 12/1997 | (JP) . |
| 10-12934 | 1/1998 | (JP) . |
| 10-84139 | 3/1998 | (JP) . |
| WO98/10474 | 3/1998 | (JP) . |
| 10-93150 | 4/1998 | (JP) . |

* cited by examiner

*Primary Examiner*—William Doerrler
*Assistant Examiner*—Chen-Wen Jiang
(74) *Attorney, Agent, or Firm*—Evenson, McKeown, Edwards & Lenahan, P.L.L.C.

(57) ABSTRACT

With an object to provide a thermoelectric converter excellent in performance, this invention provides a thermoelectric converter provided with a first thermal converter 1, a blocked second thermal conductor 2 connected to a predetermined position of the first conductor 1, a frame 6 made of a synthetic resin and surrounding the second conductor 2, a thermally-conductive substrate 5 with the frame 6 fixed at a basal end portion 8 thereof on the substrate and also with a group of thermoelectric elements 4 supported inside the substrate, and a heat-insulating layer 31 interposed between the first thermal conductor 1 and the thermally-conductive substrate 5 such that the frame 6 is surrounded at an outer periphery thereof by the heat-insulating layer. The second thermal conductor 2 and the thermally-conductive substrate 5 are opposing each other and are maintained in close contact with each other via the group of thermoelectric elements 4. The second thermal conductor 2 and the frame 6 are provided with an engaging flange 12, which prevents the second thermal conductor 2 from undergoing a displacement toward the first thermal conductor 1, and an engaged portion 9 which is in engagement with the engaging flange.

11 Claims, 8 Drawing Sheets

THERMOELECTRIC CONVERTER

TECHNICAL FIELD

This invention relates to a thermoelectric converter useful in a refrigerator including a cold storage box or a frozen storage box, a warm storage box including a heat-insulated storage box, or the like, and especially to a thermoelectric converter of a construction that the thermoelectric converter is provided with a first thermal conductor, a second thermal conductor connected to a predetermined position of the first thermal conductor, a frame made of a synthetic resin and surrounding the second thermal conductor, a thermally-conductive substrate with the frame fixed at a basal end portion thereof on the substrate and also with a group of thermoelectric elements supported inside the substrate, and a heat-insulating layer interposed between the first thermal conductor and the thermally-conductive substrate to surround the frame at an outer periphery thereof by the heat-insulating layer and that the second thermal conductor and the thermally-conductive substrate are opposing each other and are maintained in close contact with each other via the group of thermoelectric elements.

BACKGROUND ART

FIG. 18 is a cross-sectional view of a thermoelectric converter useful in a refrigerator or the like. A group of thermoelectric elements 103 is arranged on an outer surface of a metallic container made of aluminum with an aluminum-made, blocked heat-absorbing-side thermal conductor 102 interposed therebetween, and a heat-dissipating-side thermal conductor 105 provided with heat-dissipating fins 104 is disposed on an outer side of the group of thermoelectric elements 103.

A heat-insulating layer 106 is interposed between the metallic container 101 and the heat-dissipating-side thermal conductor 105 such that the blocked heat-absorbing-side thermal conductor 102 and the thermoelectric element group 103 are surrounded by the heat-insulating layer. Although not illustrated in the drawing, the heat-insulating layer 106 is composed of a frame member, which is formed of a molded body of a synthetic resin, and a heat-insulating material filled inside the frame member and made of a foamed resin such as polyurethane.

In the above-described construction, accurate dimensions can hardly be achieved due to molding strains or the like because the frame member defining the contour of the heat-insulating layer 106 is formed of the molded body of the synthetic resin. Further, the thickness of the heat-insulating layer 106 tends to become greater than a predetermined dimension due to an expansion which in turn takes place as a result of foaming of the heat-insulating material.

In general, the metallic container 101 and the heat-absorbing-side thermal conductor 102 are connected together by bolts or the like, and the thermoelectric element group 103 is attached to the heat-dissipating-side thermal conductor 105. Due to the interposition of the heat-insulating layer 106 between the metallic container 101 and the heat-dissipating-side thermal conductor 105, the close contact between the heat-absorbing-side thermal conductor 102 and the thermoelectric element group 103 tends to deteriorate due to the above-mentioned dimensional scatters and expansions. This results in a higher thermal resistance, thereby developing a problem that the thermoelectric conversion characteristics are lowered.

An object of the present invention is to solve such drawbacks of the conventional art and to provide a thermoelectric converter excellent in performance.

DISCLOSURE OF THE INVENTION

To achieve the above-described object, the present invention is directed to a thermoelectric converter provided with a first thermal conductor, for example, in the form of a container, a second thermal conductor connected to a predetermined position of the first thermal conductor, a frame made of a synthetic resin and surrounding the second thermal conductor, thermally-conductive substrate with the frame fixed at a basal end portion thereof on the substrate and also with a group of thermoelectric elements supported inside the substrate, and a heat-insulating layer interposed between the first thermal conductor and the thermally-conductive substrate such that the frame is surrounded at an outer periphery thereof by the heat-insulating layer, wherein the second thermal conductor and the thermally-conductive substrate are opposing each other and are maintained in close contact with each other via the group of thermoelectric elements.

The present invention is characterized in that the second thermal conductor and the frame are provided with an engaging projection, which prevents the second thermal conductor from undergoing a displacement toward the first thermal conductor, and an engaged portion which is in engagement with the engaging projection.

BEST MODES FOR CARRYING OUT THE INVENTION

The arrangement of the engaging projection and the engaged portion on the second thermal conductor and the frame as described in the above makes it possible to prevent a displacement of the second thermal conductor, which would otherwise take place by a pulling force of the heat-insulating layer. Accordingly, the close contact between the second thermal conductor and the group of thermoelectric elements is always maintained so that excellent thermoelectric conversion characteristics can be exhibited over a long time.

Figure 1:
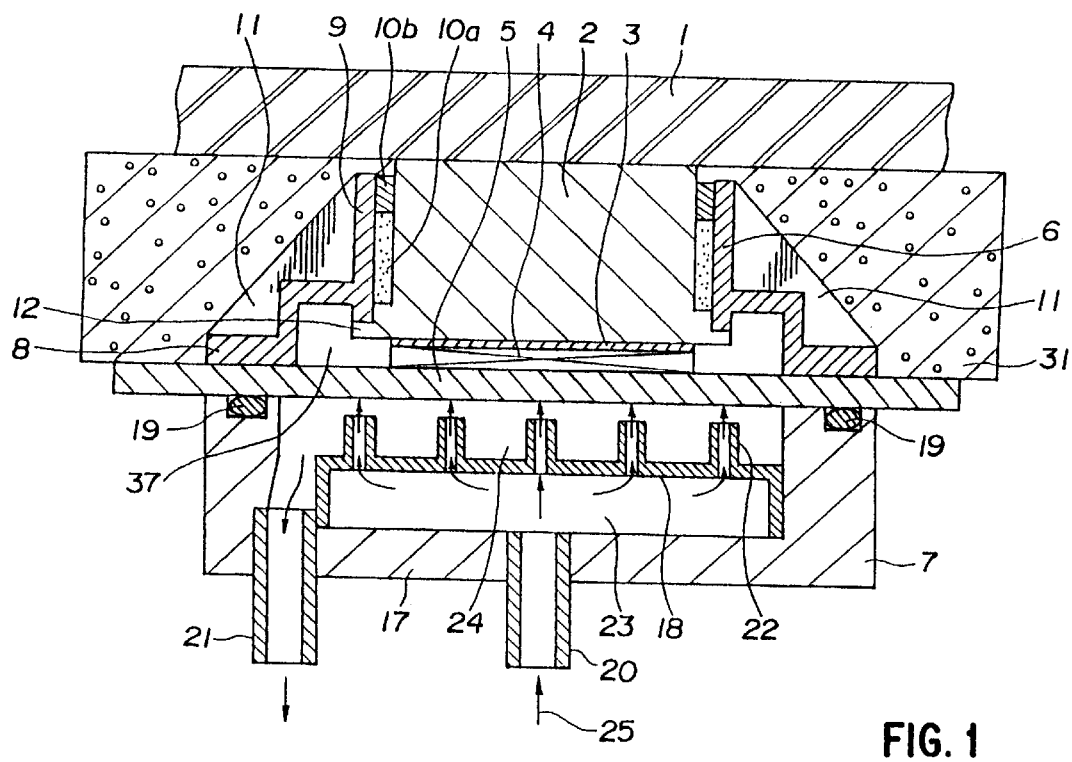
FIG. 1 is a fragmentary cross-sectional view of a thermoelectric converter according to an embodiment of the present invention.
Figure 2:
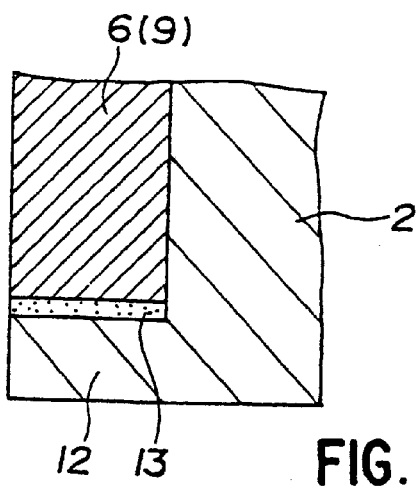
FIG. 2 is an enlarged fragmentary cross-sectional view showing an engagement structure between an engaging flange and an extended portion in the thermoelectric converter.
Figure 3:
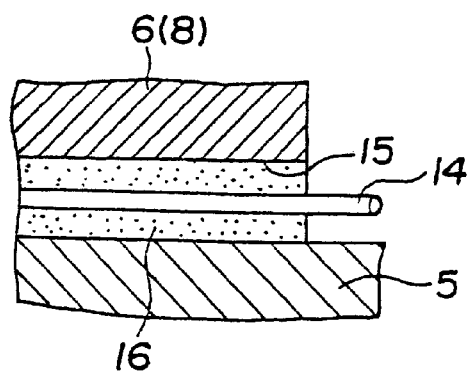
FIG. 3 is an enlarged fragmentary cross-sectional view illustrating a lead-out structure for a lead wire in the thermoelectric converter.

An embodiment of the present invention will next be described with reference to the drawings. FIG. 1 is a fragmentary cross-sectional view of a thermoelectric converter according to an embodiment of the present invention, which is useful in a thermoelectric refrigerator, FIG. 2 is an enlarged fragmentary cross-sectional view showing an engagement structure between an engaging flange and an extended portion in the thermoelectric converter, and FIG. 3 is an enlarged fragmentary cross-sectional view illustrating a lead-out structure for a lead wire.

A heat-absorbing-side second thermal conductor 2, which is formed into blocks to have a large heat capacity, is arranged on a suitable location of an outer surface of a heat-dissipating-side thermal conductor 1 having a container shape to form a refrigerate storage compartment or a frozen storage compartment. These thermal conductors are joined together by suitable connecting means (not shown) such as plural bolts.

On an outer surface of the heat-dissipating-side second thermal conductor 2, a group of thermoelectric elements 4 having a cascade structure is arranged via a thin elastic film 3 having excellent thermal conductivity and made, for example, of a filled silicone resin or the like.

The thermoelectric element group 4 is supported on a heat-dissipating-side substrate 5. A frame 6 is adhered and fixed on a side of the heat-dissipating-side substrate 5, said side opposing the heat-absorbing-side first thermal conductors 1, 2, and on its opposite side, a water-cooling jacket 7 is adhered and fixed. The first thermal conductor 1, the second thermal conductor 2 and the heat-dissipating-side substrate 5 are formed of a metal having good thermal conductivity, for example, aluminum or the like.

The frame 6 is formed of a hollow molded body of a synthetic resin, which is open at top and bottom thereof, and has a basal end portion 8 and an extended portion 9 extending upward from the basal end portion 8. Its cross-sectional shape is substantially in the form of a stair case. Plural reinforcing ribs 11 are arranged extending from the extended portion 9 to the basal end portion 8.

Inside the extended portion 9 which is arranged along four sides, the second thermal conductor 2 is fitted. An adhesive 10 is injected into a gap between a peripheral wall of the second thermal conductor 2 and an inner wall of the extended portions 9, so that the second thermal conductor 2 and the frame 6 are integrally joined together.

As the adhesive 10, a hardenable adhesive 10a, for example, of the epoxy base or acrylic base or of the hot melt type and a low-temperature flexible adhesive 10b, for example, of the butyl rubber base or modified silicone base are used in combination. The former adhesive is injected deep into the gap, while the latter is injected to a side closer to an inlet than the hardenable adhesive 10a (to an open side). The hardenable adhesive 10a may be used singly, but involves a potential problem in that the adhesiveness of the resulting hardened adhesive may be lowered when brought into contact with water (moisture) or subjected to repeated temperature cycles at low temperatures. By preventing water (moisture) from penetrating to the hardened adhesive 10a owing to the use of the above-described low-temperature flexible adhesive 10b, stable adhesion strength can be obtained over a long time.

The second thermal conductor 2 is provided at a lower portion thereof with an engaging flange 12 such that the engaging flange projects outwards. As is illustrated in FIG. 2, this engaging flange 12 is in engagement and adhesion with a lower end portion of the extended portion 9 of the frame 6 via an adhesive 13, for example, of the epoxy base or acrylic base. Accordingly, the lower end portion of the extended portion 9 is functioning as an engaged portion in this embodiment.

As is illustrated in FIG. 3, a lead wire 14, which extends out from the above-described thermoelectric element group 4, is inserted together with an adhesive 16, for example, of the epoxy base or acrylic base, in a through-groove 15 formed in a lower surface of the basal end portion 8 of the frame 6, and extends out in a liquid- and air-tight fashion from a joined part between the frame 6 (basal end portion 8) and the heat-dissipating-side substrate 5.

An electrically-insulating film (not shown), such as an anodized alumina film, is formed on a surface of the heat-dissipating substrate 5, said surface opposing the thermoelectric element group 4. The surface of this electrically-insulating film is not fully smooth, so that no sufficient close contact may not be obtained upon adhering the basal end portion 8 of the frame 6 with the peripheral portion of the heat-dissipating-side substrate 5. It is therefore desired to adhere the peripheral portion of the heat-dissipating-side substrate 5 with the basal end portion 8 of the frame 6 after removing the electrically-insulating film at the peripheral portion and making the peripheral portion smooth.

For this adhesion, use of such a double-layer structure that, as is illustrated in FIG. 1, a hardenable adhesive, for example, of the epoxy base or acrylic base or the hot melt type is injected into the interior of the joined part between the basal end portion 8 and the peripheral portion of the heat-dissipating-side substrate 5 and a low-temperature flexible adhesive, for example, of the butyl rubber base or modified silicone base is injected to a side close to the outer peripheral portion than the hardenable adhesive can effectively prevent penetration of water or moisture, thereby making it possible to exhibit stable sealing effect over a long time.

Referring back to FIG. 1 again, the water-cooling jacket 7 is constructed primarily of a hollow casing 17, which is substantially closed at the bottom thereof and is open at the top thereof, and also of a distributing member 18 arranged within the hollow space of the casing 17.

A basal portion of the casing 17 is joined in a liquid-tight fashion to the heat-dissipating-side substrate 5 via an O-ring 19 and an adhesive (not shown). The O-ring 19 may be omitted although it is used in this embodiment. The casing 17 is provided at a substantially central portion thereof with a supply pipe 20 and adjacent a peripheral edge thereof with a drain pipe 21.

The distributing member 18 is provided with a multiplicity of nozzles 22 which extend close to the surface of the heat-dissipating-side substrate 5, and by the arrangement of the distributing member 18 within the casing 17, flattened first space 23 and second space 24 are formed.

When a heat transfer medium, e.g., water 25 such as purified water is supplied through the central supply pipe 20 as shown in the same drawing, the water 25 immediately spreads out in the first space 23 and is vigorously injected in substantially a vertical direction from the respective nozzles 22 toward the lower surface of the heat-dissipating-side substrate 5. The water 25, which has hit the heat-dissipating-side substrate 5 and has then absorbed water therefrom, promptly spreads out in the second space 24 having a small height, and is discharged out of the system through the drain pipe 21. The discharged water 25 is cooled in an unillustrated heat-dissipating radiator and is returned for reuse through a forced recirculation system.

Although the water 25 is used as the heat transfer medium in this embodiment, an anti-freeze may be used as a heat transfer medium depending on the use conditions of a thermoelectric refrigerator.

As is shown in FIG. 1, a heat-insulating layer 31 is interposed between the heat-absorbing-side first thermal conductor 1 and the heat-dissipating-side substrate 5 such that the heat-insulating layer surrounds the outer periphery of the frame 6. Although not illustrated in the drawing, this heat-insulating layer 31 is composed of a frame member, which is formed of a molded body of a synthetic resin and defines the contour, and a heat-insulating material filled inside the frame member and made of a foamed resin such as polyurethane. As this heat-insulating material, a sealing agent of the silicone base can also be used.

Figure 4:
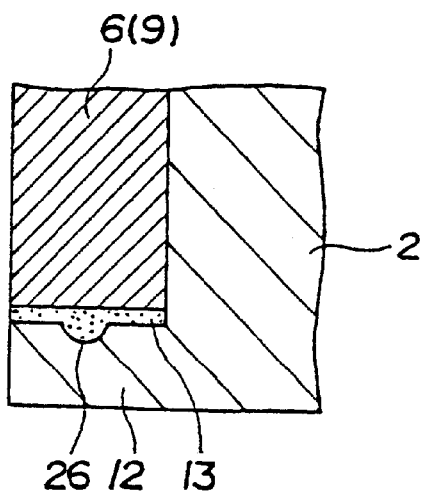
FIG. 4 is an enlarged fragmentary cross-sectional view depicting a modification of the engagement structure between the engaging flange and the extended portion.
Figure 5:
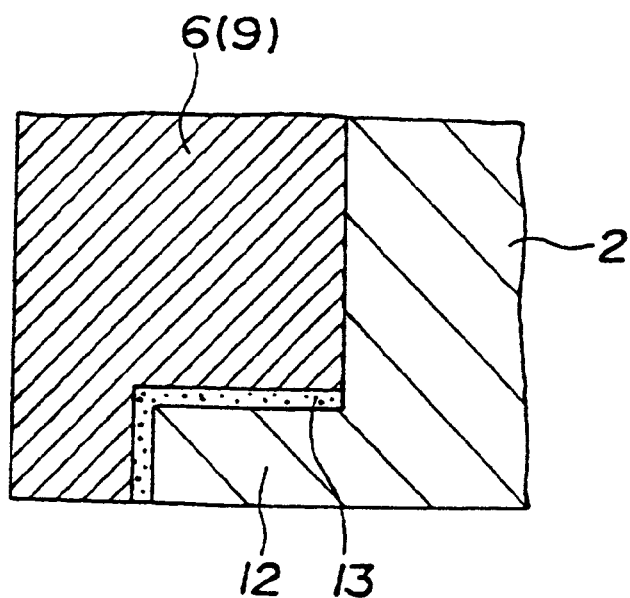
FIG. 5 is an enlarged fragmentary cross-sectional view showing a further modification of the engagement structure between the engaging flange and the extended portion.

FIG. 4 and FIG. 5 are enlarged fragmentary cross-sectional views, which illustrate modifications of the joined part between the engaging flange 12 of the second thermal conductor 2 and the extended portion 9 of the frame 6. In the modification of FIG. 4, a recessed adhesive well 26 is formed in a surface of the engaging flange 12, said surface opposing the extended portion 9. As an alternative, this adhesive well 26 may be formed in a surface of the extended portion 9, said surface being opposing the engaging flange 12. In the modification of FIG. 5, the lower end portion of the extended portion 9 is formed in a step such that the lower end portion covers upper and side walls of the engaging flange 12, and an adhesive 13 is interposed therebetween.

Figure 6:
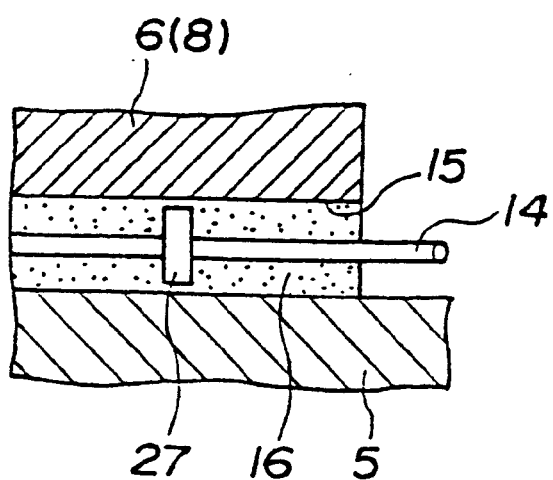
FIG. 6 is an enlarged fragmentary cross-sectional view showing a modification of the lead-out structure for the lead wire.
Figure 7:
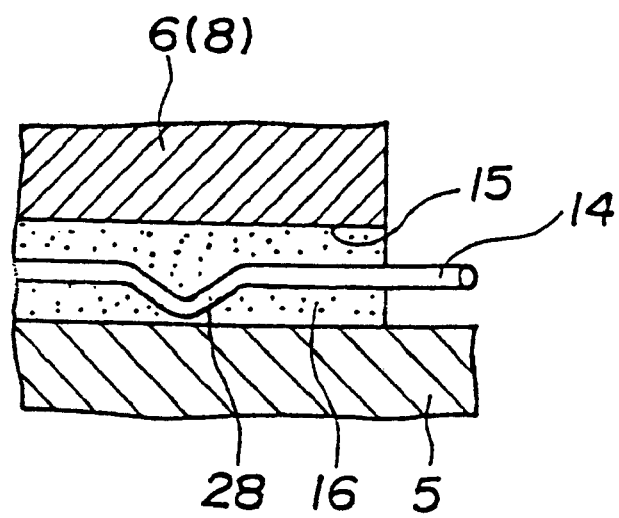
FIG. 7 is an enlarged fragmentary cross-sectional view illustrating a further modification of the lead-out structure for the lead wire.
Figure 8:
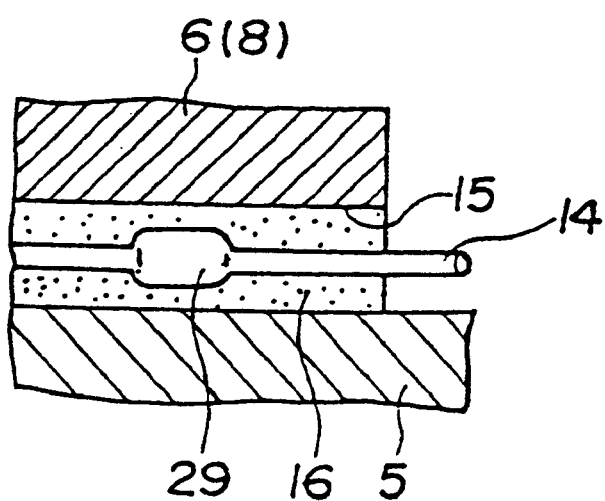
FIG. 8 is an enlarged fragmentary cross-sectional view illustrating a still further modification of the lead-out structure for the lead wire.
Figure 9:
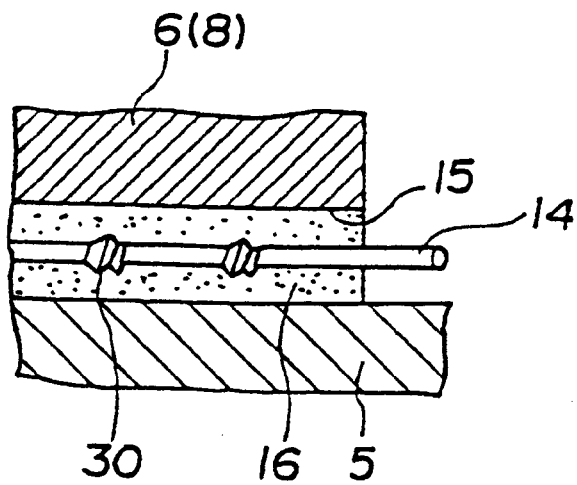
FIG. 9 is an enlarged fragmentary cross-sectional view illustrating a still further modification of the lead-out structure for the lead wire.

FIG. 6 through FIG. 9 are enlarged fragmentary cross-sectional views showing modifications of the lead wire 14. In the modification of FIG. 6, one or plural rings 27 are connected at predetermined intervals on an outer peripheral wall of the lead wire 14 buried in the adhesive 16. In the modification of FIG. 7, the lead wire 14 is provided, at a section thereof buried in the adhesive 16, with one or plural bent portions 28. In the modification of FIG. 8, the lead wire 14 is partially flattened, at a section thereof buried in the adhesive 16, into oval-shaped deformed portions 29. In the modification of FIG. 9, the lead wire 14 is formed, at an outer peripheral wall of a section thereof buried in the adhesive 16, into a multiplicity of ridge-groove portions.

The adoption of such modifications as shown in FIG. 6 through FIG. 9 makes it possible to enhance the adhesion between the lead wire 14 and the adhesive 16, thereby making an improvement in the breaking strength of the lead wire 14, and further to increase the creepage distance, thereby effectively preventing the penetration of water.

Figure 10:
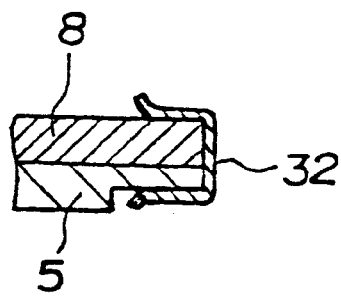
FIG. 10 is a fragmentary cross-sectional view depicting a modification of a connection structure between a heat-dissipating-side substrate and a basal end portion of a frame.
Figure 11:
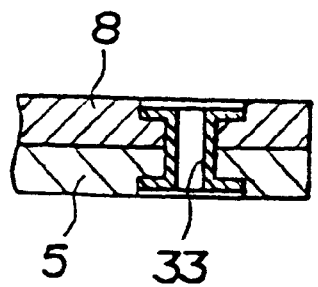
FIG. 11 is a fragmentary cross-sectional view showing another modification of the connection structure between the heat-dissipating-side substrate and the basal end portion of the frame.

FIG. 10 and FIG. 11 are enlarged fragmentary cross-sectional views illustrating modifications of the connection structure between the basal end portion 8 of the frame 6 and the outer peripheral portion of the heat-dissipating-side substrate 5. In the modification of FIG. 10, the basal end portion 8 and the outer peripheral portion of the heat-dissipating-side substrate 5 are resiliently pinched at outer peripheries thereof by clips 32 made of a metal or synthetic resin with or without an adhesive or a thin elastic film. These clips 32 may be arranged on the four sides or on only two sides opposing each other. In the illustrated embodiment, a stepped portion is formed only on the heat-dissipating-side substrate 5 to avoid projection of the clips 32 from the surface of the heat-dissipating-side substrate 5. As an alternative, a stepped portion may also be formed on the basal end portion 8 of the frame so that the clips 32 can be prevented from projecting out from the surface of the basal end portion 8.

In the modification of FIG. 11, the basal end portion 8 and the outer peripheral portion of the heat-dissipating-side substrate 5 are connected together by metal-made eyelets 33 arranged at predetermined intervals with or without an adhesive or a thin elastic film interposed therebetween. Screws made of a metal or synthetic resin can be used in place of these eyelets 33, but the use of the eyelets 33 makes it possible to achieve the connection in a shorter time.

Figure 12:
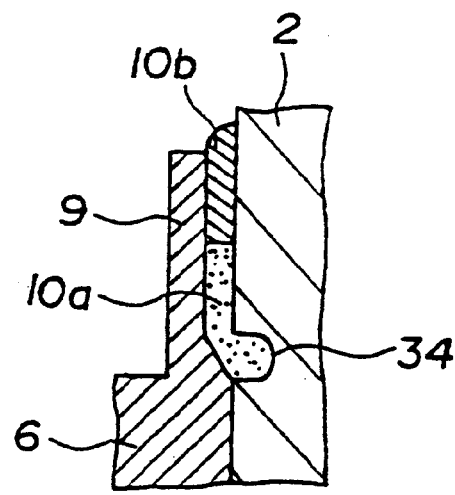
FIG. 12 is an enlarged fragmentary cross-sectional view depicting a modification of a connection structure between a heat-dissipating-side second thermal conductor and the frame.
Figure 13:
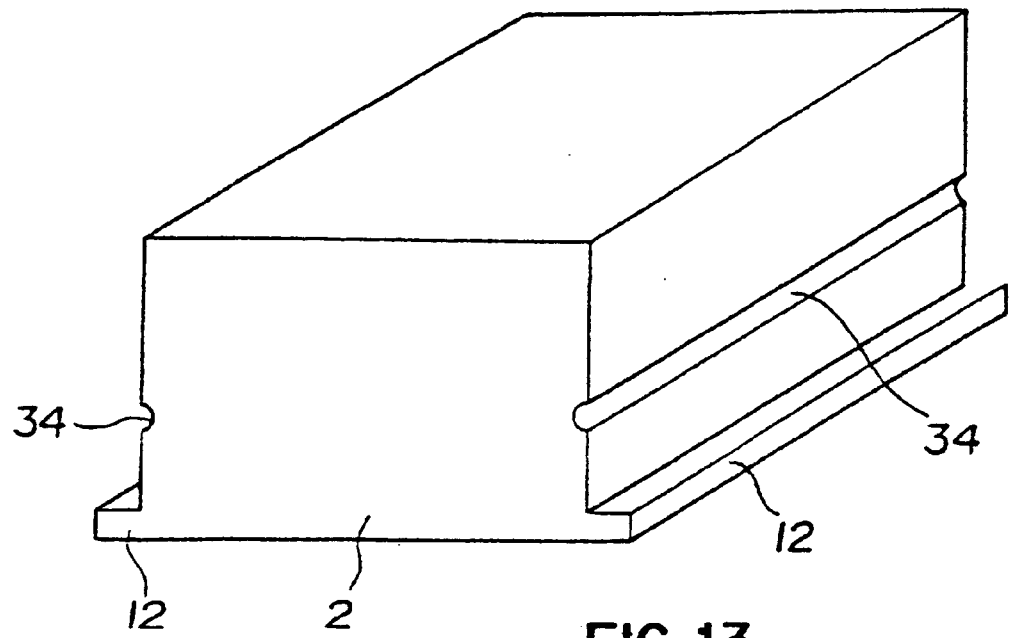
FIG. 13 is a perspective view of the heat-dissipating-side second thermal conductor used in the modification.

FIG. 12 through FIG. 16 are drawings which show modifications of adhesion between the second thermal conductor 2 and the frame 6. In the embodiment of FIG. 12 and FIG. 13, one or several grooves 34 are formed in each side wall of the second thermal conductor 2 such that the grooves 34 extend in a horizontal direction, in other words, in a direction perpendicular to displacements of the second thermal conductor 2, which would otherwise take place by pulling forces of the heat-insulating layer 31. Each groove 34 is filled with an adhesive 10 (a hardened adhesive 10a, or a low-temperature flexible adhesive 10b). The second thermal conductor 2, which are provided on both side surfaces thereof with the engaging flanges 12 and the grooves 34 as illustrated in FIG. 13, can be obtained with good mass producibility, for example, by extrusion or the like.

Figure 14:
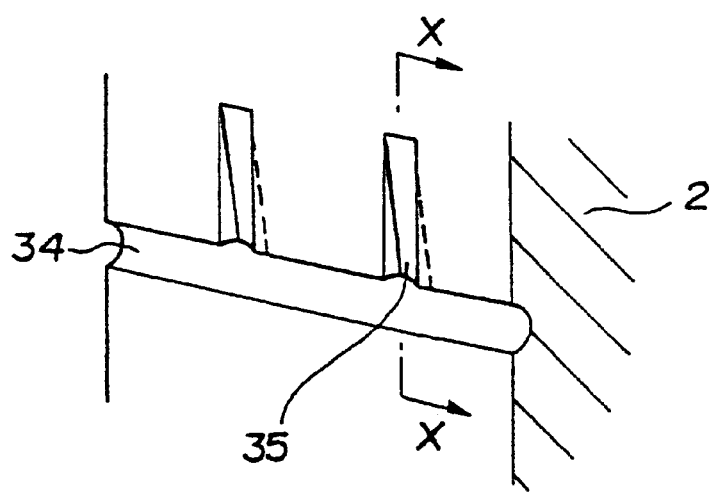
FIG. 14 is a fragmentary perspective view showing a further modification of the heat-dissipating-side second thermal conductor.
Figure 15:
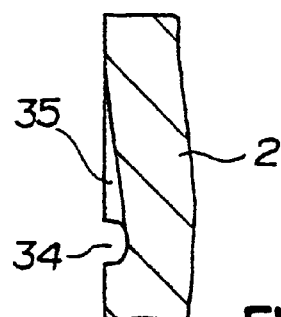
FIG. 15 is a cross-sectional view taken along line X—X of FIG. 14.

FIG. 14 and FIG. 15 are drawings which illustrate a still further modification, and FIG. 15 is a cross-sectional view taken along line X—X of FIG. 14. In this modification, each side wall of the second thermal conductor 2 is provided with a groove 34 formed in a horizontal direction and also with one or several tapered air vent grooves 34 extending upward relative to the groove 34. Upon filling an adhesive 10 (a hardenable adhesive 10a, or a low-temperature flexible adhesive 10b), air is allowed to efficiently escape through the grooves 35 so that the adhesive 10 can be filled surely. Although one or several air vent grooves 35 are formed per groove 34 in this embodiment, an air vent portion (adhesive-filling portion) may be formed at a width substantially the same as the groove 34 over the entire side wall.

Figure 16:
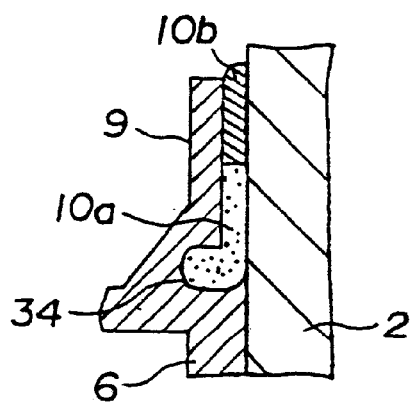
FIG. 16 is an enlarged fragmentary cross-sectional view showing a further modification of the connection structure between the heat-dissipating-side second thermal conductor and the frame.

FIG. 16 is a drawing which depicts a still further modification, and illustrates an example in which one or several grooves 34 are formed on the side of the frame 6. These grooves 34 may be arranged on both of the second thermal conductor 2 and the frame 6.

Although not illustrated in these drawings, a number of continuous or discontinuous convexities and concavities can be formed on each side wall of the second thermal conductor 2 and/or the frame 6, said side wall being brought into contact with the adhesive 10 (a hardenable adhesive 10a, or a low-temperature flexible adhesive 10b), whereby the area of adhesion can be increased and further, the creepage distance can be made longer to prevent penetration of water or moisture.

Figure 17:
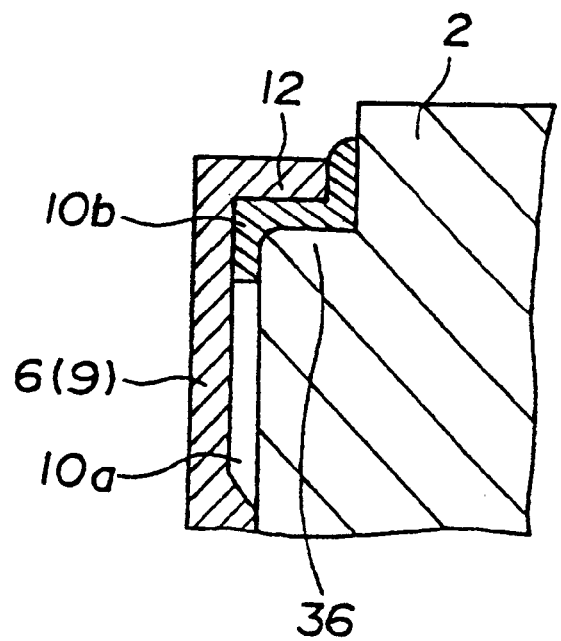
FIG. 17 is an enlarged fragmentary cross-sectional view depicting a still further modification of the connection structure between the heat-dissipating-side second thermal conductor and the frame.
Figure 18:
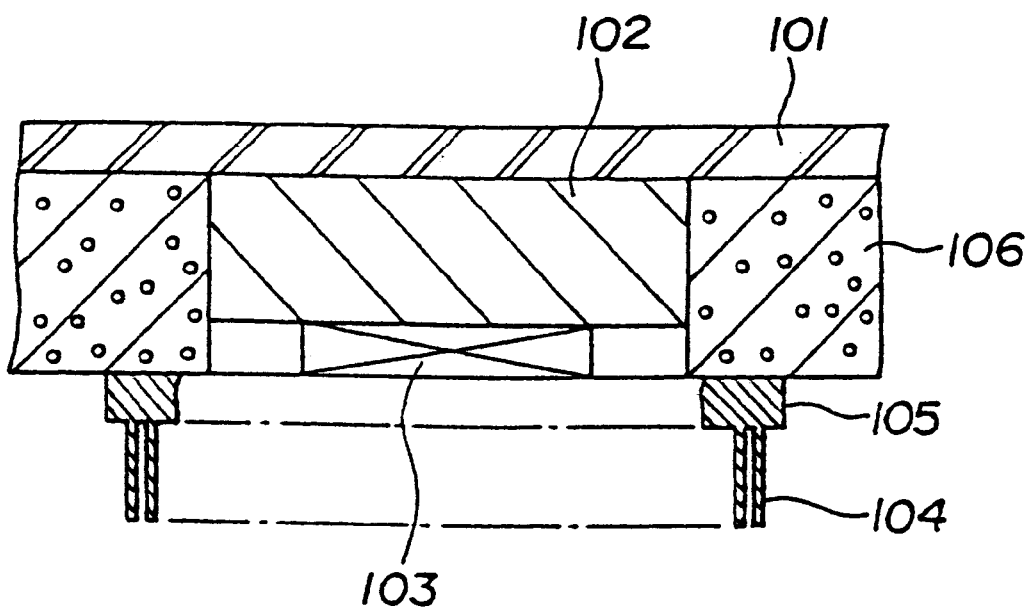
FIG. 18 is a cross-sectional view of a conventional thermoelectric converter.

FIG. 17 is a drawing which shows a still further modification of the engagement between the second thermal conductor 2 and the frame 6. In this example, a stepped portion 36 is formed at an upper shoulder portion of the second thermal conductor 2 and on the other hand, the frame 6 (the extended portion 9) is provided at an upper edge thereof with an engaging flange 12 extending inwards. This engaging flange 12 is brought into engagement with the stepped portion 36 via an adhesive 10 (a hardenable adhesive 10a, or a low-temperature flexible adhesive 10b), thereby making it possible to prevent a displacement of the second thermal conductor 2 relative to the frame 6. In this embodiment, the stepped portion 36 is functioning as an engaged portion and, as is illustrated in the drawing, the engaging flange 12 is arranged such that it does not project out from the upper surface of the second thermal conductor 2.

Incidentally, a space 37—which is defined by the second thermal conductor 2, the thermoelectric element group 4, the heat-dissipating-side substrate 5, the frame 6 and the like—may be filled with a substance having lower thermal conductivity than air (for example, fine titanium oxide particles, carbon dioxide, argon gas, or the like).

The thermoelectric element group 4 used in the above-described embodiment was of a skeleton structure which does not use a substrate. It is however also possible to use a thermoelectric element group provided on only one side thereof with a substrate or on both sides thereof with substrates.

In the embodiment described above, the description was made about the case of the water-cooling system. The present invention is however not limited to such a water-cooling system, and is also applicable to an air-cooling system.

In the embodiment described above, the description was made about the example in which the thermoelectric converter was used for thermoelectric cooling. The present invention is however not limited to such a use, and the thermoelectric converter can also be used for heating, warming or the like.

Capability of Exploitation in Industry

According to the present invention, the arrangement of the engaging projection and the engaged portion on the second thermal conductor and the frame as described above makes it possible to prevent a displacement of the second thermal conductor, which would otherwise take place by a pulling force of the heat-insulating layer, and hence to always maintain the second thermal conductor and the group of thermoelectric elements in close contact with each other. Excellent thermoelectric conversion characteristics can therefore be exhibited over a long time.

What is claimed is:

1. A thermoelectric converter provided with:
   a first thermal conductor,
   a second thermal conductor connected to a predetermined position of said first thermal conductor,
   a frame made of a synthetic resin and surrounding said second thermal conductor,
   a thermally-conductive substrate with said frame fixed at a basal end portion thereof on said substrate and also with a group of thermoelectric elements supported inside said substrate, and
   a heat-insulating layer interposed between said first thermal conductor and said thermally-conductive substrate such that said frame is surrounded at an outer periphery thereof by said heat-insulating layer,
   wherein said second thermal conductor and said thermally-conductive substrate are opposing each other and are maintained in close contact with each other via said group of thermoelectric elements, characterized in that:
      said second thermal conductor and said frame are provided with an engaging projection, which prevents said second thermal conductor from undergoing a displacement toward said first thermal conductor, and an engaged portion which is in engagement with said engaging projection.

2. A thermoelectric converter according to claim 1, wherein an adhesive is interposed between said engaging projection and said engaged portion.

3. A thermoelectric converter according to claim 1, wherein said frame is provided with an extended portion such that said second thermal conductor is surrounded by said extended portion, and an adhesive is interposed between said second conductor and said extended portion.

4. A thermoelectric converter according to claim 3, wherein said adhesive comprises a hardened adhesive injected inside a joined portion and a low-temperature flexible adhesive injected on an open side of said joined portion.

5. A thermoelectric converter according to claim 3, wherein a recessed portion to be filled with said adhesive is formed in said second thermal conductor or said extended portion thereof.

6. A thermoelectric converter according to claim 5, wherein said recessed portion is a groove extending in a direction which intersects at a right angle a direction of displacement of said second thermal conductor.

7. A thermoelectric converter according to claim 5 or 6, wherein an air vent groove is formed in said recessed portion.

8. A thermoelectric converter according to claim 3, wherein said engaging projection is arranged on said second thermal conductor, and said engaged portion is an end portion of said extended portion.

9. A thermoelectric converter according to claim 3, wherein said engaging projection is arranged on an end portion of said extended portion, and said engaged portion is a stepped portion formed on the second thermal conductor.

10. A thermoelectric converter according to claim 9, wherein said engaging projection does not project out from an end surface of said second thermal conductor.

11. A thermoelectric converter according to claim 1, wherein a thin elastic film having good thermal conductivity is interposed between said second thermal conductor and said group of thermoelectric elements.

* * * * *